(12) United States Patent
Leizerovich et al.

(10) Patent No.: US 6,374,092 B1
(45) Date of Patent: Apr. 16, 2002

(54) EFFICIENT MULTIMODE POWER AMPLIFIER

(75) Inventors: Gustavo D. Leizerovich, Miami Lakes, FL (US); Lawrence F. Cygan, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/455,813

(22) Filed: Dec. 4, 1999

(51) Int. Cl.[7] ................................. H01Q 11/12
(52) U.S. Cl. .................. 455/127; 455/126; 455/127; 330/295; 330/124 R
(58) Field of Search .................. 455/116, 126, 455/127, 552, 553; 330/124 R, 295

(56) References Cited

U.S. PATENT DOCUMENTS

| | | | |
|---|---|---|---|
| 5,420,541 A | * | 5/1995 | Upton et al. |
| 5,739,723 A | * | 4/1998 | Sigmon et al. |
| 5,757,229 A | * | 5/1998 | Mitzlaff |
| 5,986,508 A | * | 11/1999 | Nevin |
| 6,014,571 A | * | 1/2000 | Enoki |
| 6,049,707 A | * | 4/2000 | Buer et al. |
| 6,262,629 B1 | * | 7/2001 | Stengel et al. |

* cited by examiner

Primary Examiner—Daniel Hunter
Assistant Examiner—Khawar Iqbal
(74) Attorney, Agent, or Firm—Scott M. Garrett

(57) ABSTRACT

An amplifier apparatus for a multimode mobile communication device includes a carrier amplifier (114) and a peaking amplifier (116). The peaking amplifier has an adjustable bias level and is adjusted by a regulator to a predetermined level, depending on which mode of communication is selected. The bias level on the peaking amplifier is held constant so long as the mode of communication is the same. By adjusting the bias point of the peaking amplifier in conjunction with the selection of the mode of communication, the efficiency and the linearity of modulation can be optimized for the particular mode of communication.

8 Claims, 5 Drawing Sheets

EFFICIENT MULTIMODE POWER AMPLIFIER

TECHNICAL FIELD

The invention relates in general to radio frequency power amplifiers, and more particularly to apparatus and methods for enhancing the efficiency of a radio frequency power amplifiers for use in a mobile communication device capable of operating in several modes of communication.

BACKGROUND OF THE INVENTION

Portable wireless communication systems are in place in all metropolitan areas, and to a large extent areas outside of metropolitan areas. Communications service is available to members of the public, which use mobile communication devices to facilitate communication. Most commonly mobile telephone service is offered, and is generically known as cellular telephone service. Others types of communication service are being introduced, but mobile telephony is by far the most popular type of service.

There are a number of types of mobile telephony which are in use, such as analog cellular, more commonly known as AMPS, digital cellular in accordance with IS-136, and systems in accordance with the Global Specification for Mobile communications (GSM), as well as a number of others. When a user travels out of their home region, they may register for service over a non-home system in what is commonly referred to as a roaming mode. However, this is normally only possible if the type of communication service the user's mobile communication device was designed for is offered in the non-home region. For example, if the user's mobile communication device is designed for digital cellular, and the user is in an area that only supports analog cellular, the user will not be able to communicate using the mobile communication device.

In response to the market demand to be able to communicate over a wide geographic area, including in different countries, the industry has begun offering so called multimode mobile communication devices. A multimode mobile communication device is one that is capable of supporting more than one type of communication service, meaning it can establish communication over more than one type of air interface. The most popular multimode mobile communication devices are dual mode analog and digital cellular devices, such as Advanced Mobile Phone Service (AMPS) and North American Digital Cellular (NADC) standard IS-136 phones, and AMPS and Code Division Multiple Access (CDMA) phones such as those in accordance the NADC standard IS-95.

A problem arises in these multimode mobile communication devices because of the limitation on the available space for circuits and components. Each different mode of communication uses a different air interface, including different modulation schemes. The different modulation schemes may be as different as frequency modulation for one air interface and linear modulation for another type of air interface. Each different modulation scheme would ordinarily require the power amplifier to be configured differently to achieve optimum efficiency to increase battery life. Typically there is not enough room in a small, hand-held mobile communication device to accommodate more than one power amplifier, so in a multimode mobile communication device efficiency in one or more modes of communication is sacrificed for availability. Typically the power amplifier is designed to be efficient in what is thought to be the mode of communication that will most likely be used a majority of the time. In other operating modes battery life suffers as the result of less than optimum efficiency at the power amplifier.

Therefore a need exists for an apparatus and method of efficiently amplifying a modulated signal in a multimode mobile communication device. To optimize efficiency the amplifier characteristics must change depending on the choice of communication mode. Furthermore, the amplifying apparatus must be kept small so that it does not substantially affect the size and volume goals of present day mobile communication devices.

DETAILED DESCRIPTION OF A PREFERRED EMBODIMENT

Figure 1:
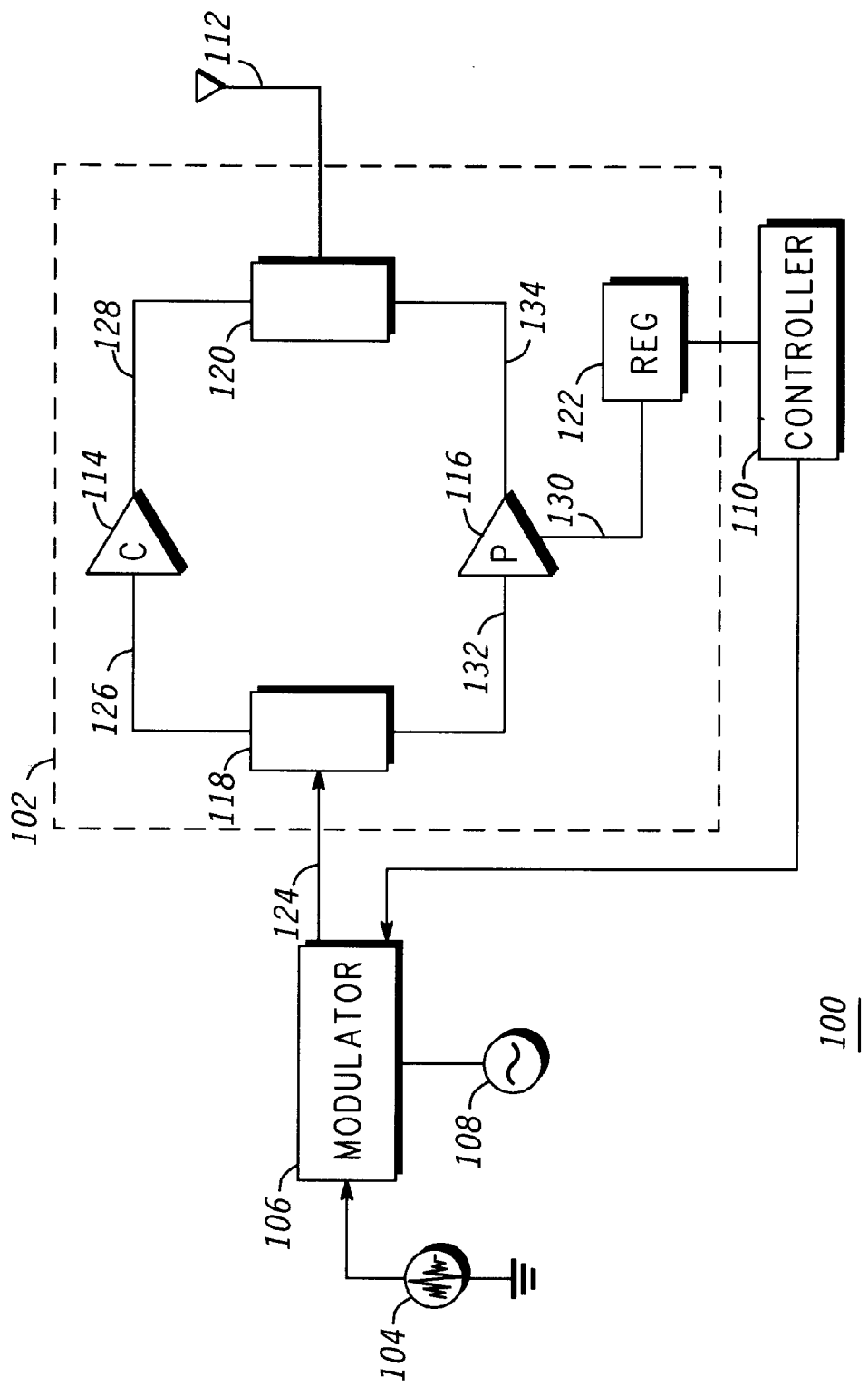
FIG. 1 shows a block diagram schematic of a multimode power amplifier apparatus for use in a multimode communication device, in accordance with the invention.

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

The invention provides a power amplifying apparatus for a multimode mobile communication device. The amplifying apparatus is capable of changing the amplifier characteristics so that it is optimized in various communication modes. Generally, the invention uses a pair of amplifiers arranged in a Doherty configuration. A carrier amplifier is generally a linear amplifier with a conduction period of about 180 degrees or more, including class A, AB, and B amplifiers. A peaking amplifier is adjustable, and conducts when the input signal magnitude is above an adjustable threshold level, and the adjustable level is set depending on the choice of communication mode.

Referring now to FIG. 1, there is shown a block diagram schematic of a multimode power amplifier apparatus 102 for use in a multimode communication device 100, in accordance with the invention. By multimode it is meant that the communication device is capable of engaging in communications using more than one air interface scheme such as, for example, AMPS and digital cellular. There are numerous other communication systems which are equally applicable and desirable to include. The multimode power amplifier apparatus addresses the problem of optimizing amplifier efficiency in each of the several modes of communication. The multimode communication device further comprises a signal source 104, a modulator 106 and a local oscillator means 108 for modulating the signal received from the signal source 104 with the appropriate modulation for the desired mode of communication. The signal source is, for example, an audio circuit including a microphone, as is well known in the art, for receiving a voice signal from the user of the multimode communication device and converting it to an appropriate electrical signal. Depending on the mode of communication desired, the signal source may provide either an analog signal or a digital signal to be modulated. The multimode communication device further comprises a controller 110 and an antenna 112 for transmitting and receiving signals over the air, and which is operably coupled to the power amplifier apparatus in a conventional manner.

The power amplifier apparatus comprises five main elements; a carrier amplifier 114, a peaking amplifier 116, an splitting means 118, a combining means 120, and a threshold control means 122. In operation, the amplifier apparatus receives an input signal on line 124 from the modulator means 106. The input signal is a radio frequency signal that includes a carrier wave modulated in accordance with the presently chosen mode of communication.

The carrier amplifier or carrier amplifier means 114 is a conventional linear amplifier means that operates in a fixed class of operation, such as, for example, class A, AB, or B operation. The carrier amplifier has a carrier input 126 for receiving signals from the splitter means 118, and a carrier output 128 coupled to the combining means. The peaking amplifier or peaking amplifier means 116 is typically a nonlinear amplifier, meaning that it is operated, for example, in class C mode. However, the peaking amplifier means comprises a threshold control input 130, which is coupled to the threshold control means 122, for controlling the bias level of the peaking amplifier. This allows the peaking amplifier to have an adjustable class of operation, and more specifically, it allows precise control of the conduction angle range of the input signal received from the splitting means 118, which is coupled to the peaking input 132. In other words, the threshold control input allows for adjusting the operating point of the peaking amplifier such that the peaking amplifier can be operated in both linear and non-linear classes. The peaking output 134 is coupled to the combining means 120. It will be appreciated by those skilled in the art that the blocks shown here to represent the carrier and peaking amplifier means include not just the active amplifier device, which is typically a transistor device, but also the passive impedance matching elements for matching the input and output impedances, as is known in the art.

In operation, the splitting means 118 splits the input signal 124 into two paths, one for the carrier amplifier path and one for the peaking amplifier path. The splitting means provides a phase differential between the carrier and peaking paths of, for example 90 degrees. The operating point of the peaking amplifier is adjusted depending on the presently selected mode of communication of the mobile communication device. That is, the peaking amplifier bias level is set to a fixed, predetermined level for the duration of the mode of communication. For example, if the presently selected mode of communication is AMPS, then the peaking amplifier threshold control input voltage level is set to a value that turns off the peaking amplifier. This has the effect of having only the carrier amplifier active in order to optimize efficiency at reduce power levels, such as those which may be used during the AMPS mode of operation. In an AMPS mode, the input signal 124 will be a continuous frequency modulated carrier signal. Other modes of communication, however, use amplitude modulation, or more generally, linear modulation. Such is the case with digital quadrature type modulation schemes, such as that employed in integrated digital radio systems, an example of which is the radio system sold under the trade name iDEN by Motorola, Inc. Amplifying linear modulation signals is inherently less efficient, as is know in the art. However, by setting the peaking amplifier into a nonlinear class of operation, a Doherty amplifier configuration is realized, which substantially increases the efficiently of operation over what may be achieved with amplifiers operated in a linear class. An example of Doherty operation for enhancing amplifier efficiency can be found in U.S. patent application No. 09/347675, entitled "POWER AMPLIFIER FOR EFFICIENTLY AMPLIFYING LINEARLY MODULATED SIGNAL," and commonly assigned with the present invention, the disclosure of which is hereby incorporated by reference. Finally, the combining means 120 combines the output of the carrier and peaking amplifier, correcting the phase differential between the two paths. The combining means also provides a Doherty combining function, meaning that when the peaking amplifier is operated in a nonlinear class, and it is not conducting, from within the combining means the peaking path looks like a very high impedance from the carrier output 128 so as not to load the carrier output.

Figure 2:
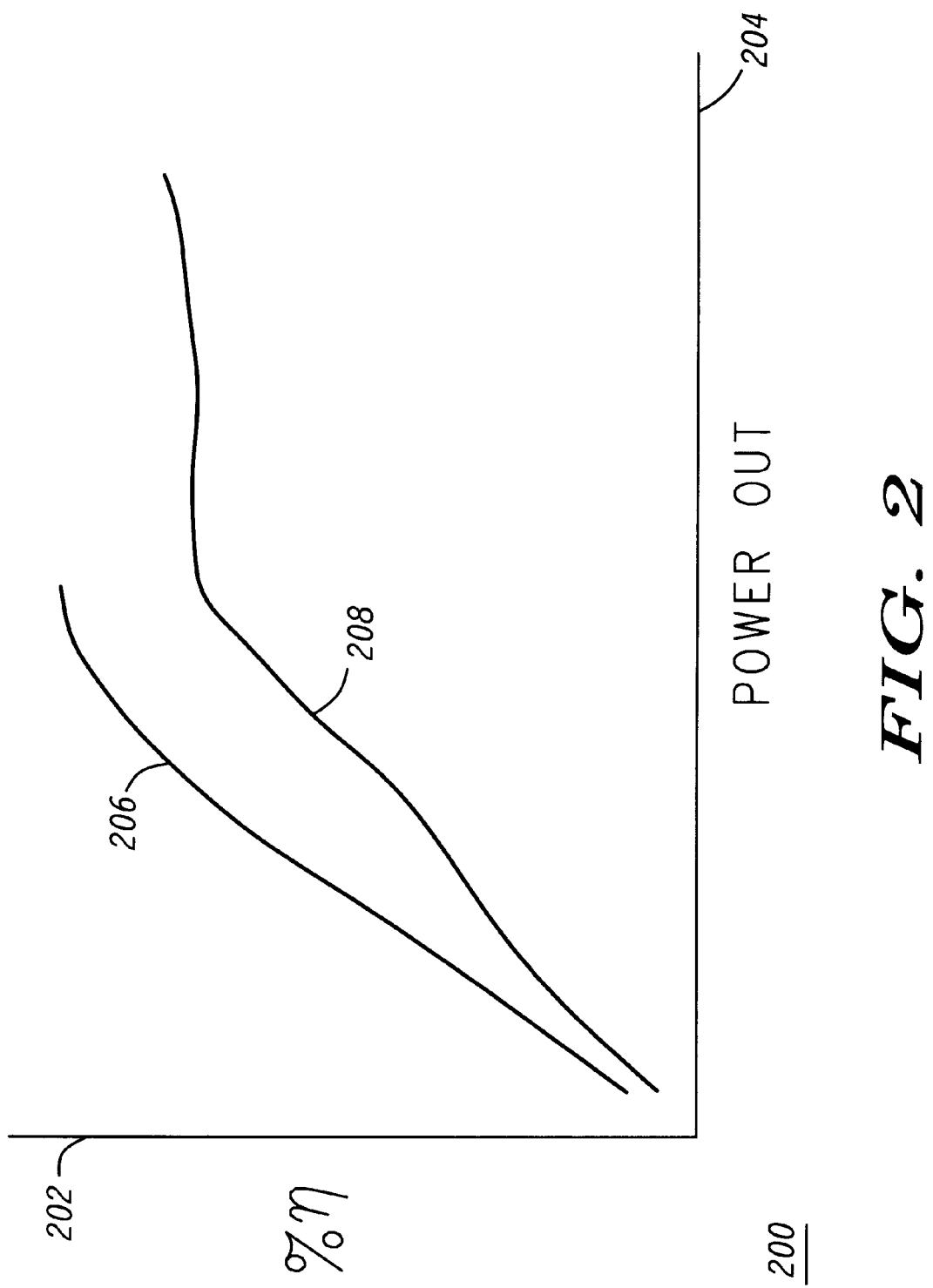
FIG. 2 shows a graph of efficiency versus output power for a multimode power amplifier apparatus, in accordance with the invention.
Figure 3:
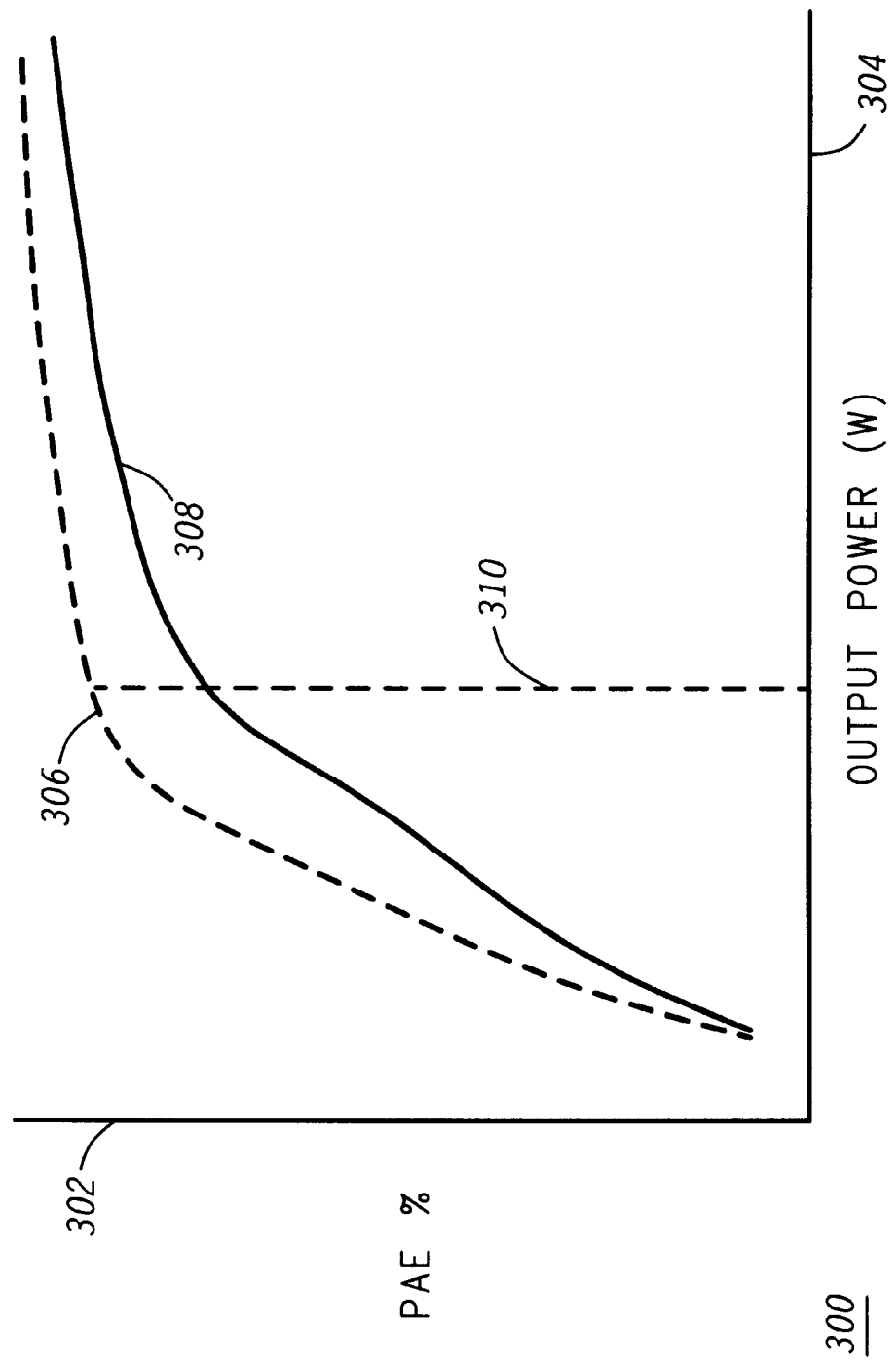
FIG. 3 shows a graph of power added efficiency versus output power for a multimode power amplifier apparatus in accordance with the invention.
Figure 4:
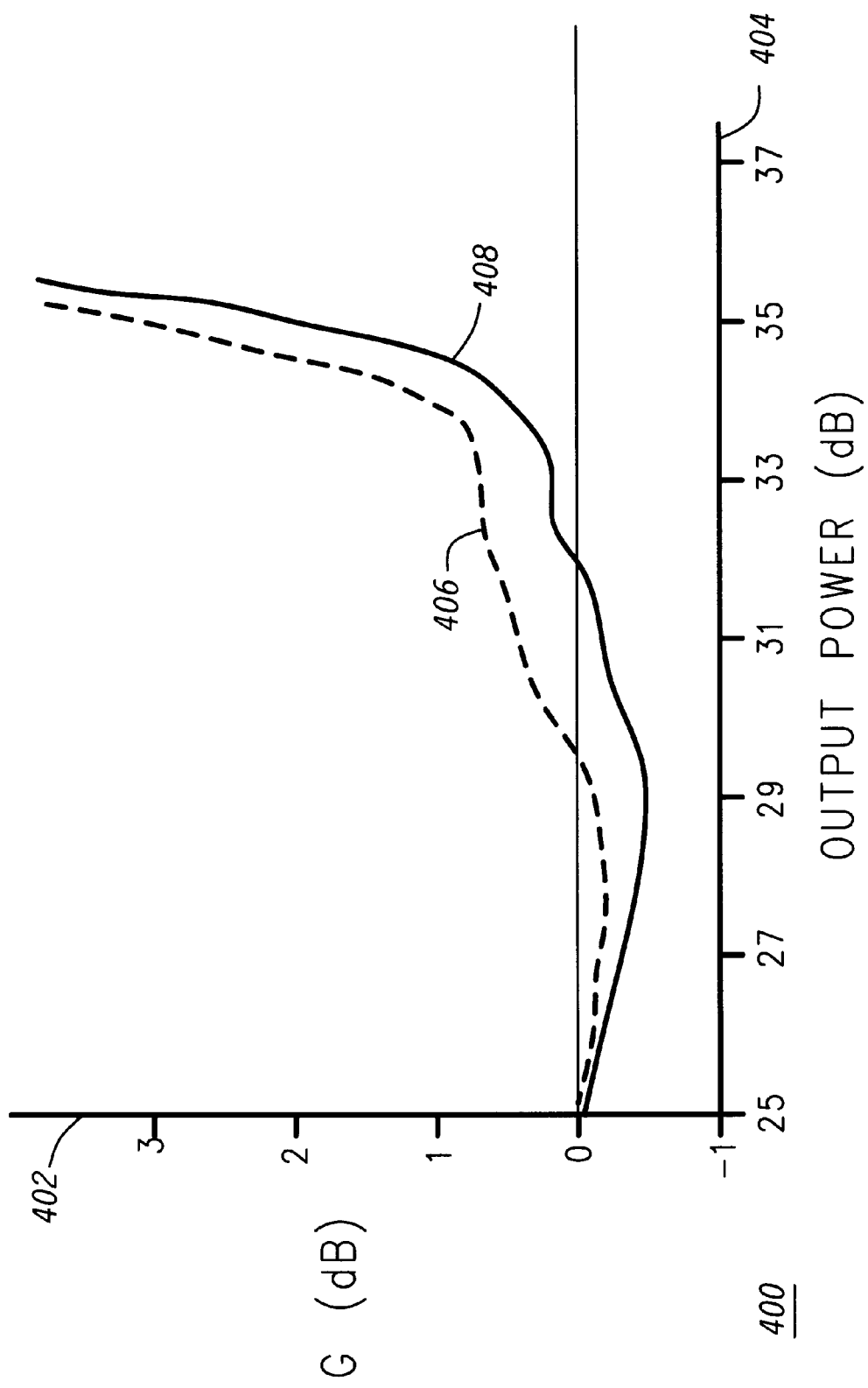
FIG. 4 shows a graph of gain compression versus output power for a multimode power amplifier apparatus in accordance with the invention.

Referring now to FIG. 2, there is shown a graph 200 of efficiency 202 versus output power 204 for a multimode power amplifier apparatus, in accordance with the invention. A first curve 206 represents the efficiency of the multimode power amplifier apparatus when the peaking amplifier is unbiased, or turned off, as when an AMPS mode of communication is selected. Since the input signal in an AMPS mode has a constant envelope magnitude, the output of the amplifier apparatus is a constant power signal. Therefore the amplifier apparatus is operated at maximum output power level, which is also the most efficient manner of operation. In linear modulation systems, however, the envelope of the input signal is constantly changing. Thus, the amplifier cannot be set to one optimum level. When a mode of communication is selected that uses linear modulation, the peaking amplifier is set to nonlinear operation to achieve a Doherty effect, as is represented by a second curve 208. The second curve shows classic Doherty operation; the curve slopes upward from a low output power level, then plateaus and has more constant efficiency for a higher range of output power. This manner of operation provides a substantial improvement in average power added efficiency, as is described in the above referenced patent application. Referring now to FIG. 3, there is shown a graph 300 of power added efficiency 302 versus output power 304 for a multimode power amplifier apparatus in accordance with the invention. A first curve 306 represents the curve of the amplifier apparatus when operated in a linear high efficiency mode, such as for an AMPS mode of communication, while a second curve 308 represent the characteristic achieved when operating the amplifier apparatus in a high linearity mode, such when operating in mode of communication employing highly linear modulation such as that required by the Enhanced Data for GSM Evolution (EDGE) standard, which is an upcoming extension to the GSM standard for higher data rates. It can be used to access the Internet at much higher speed. Line 310 represents a point of output power where amplifier apparatus is operated, for example, in an AMPS mode and the output power is constant. This is an advantage of the invention since it allows a the mobile communication device to operate in a high efficiency mode for AMPS type communication, and a high linearity mode for high data rate communications. Depending on the desired mode of communication, a high efficiency or a high linearity mode of biasing the amplifiers is used. If increased beyond this point, the quality of the output signal typically degrades. Referring now to FIG. 4, there is shown a graph 400 of gain compression 402 versus output power 404 for a multimode power amplifier apparatus in accordance with the invention. Once again, the first curve 406 represents the amplifier apparatus characteristic when operated in a high efficiency mode, such as in an AMPS mode, while a second curve 408 represents the characteristic in a high linearity mode.

It will be noted that since the operating point of the peaking amplifier is adjustable, the curves shown in FIGS. 2–4 are merely representative of two selected operating points. The amplifier apparatus can be operated at any point in between these curves, and can operated beyond these curves, they merely illustrate the characteristics achieved at different operating points of the peaking amplifier. It is a matter of engineering choice to choose the operating point that is most effective for a given mode of communication. However, the modulation used by a given communication mode strongly dictates to which operating characteristics the amplifier apparatus will be set.

Figure 5:
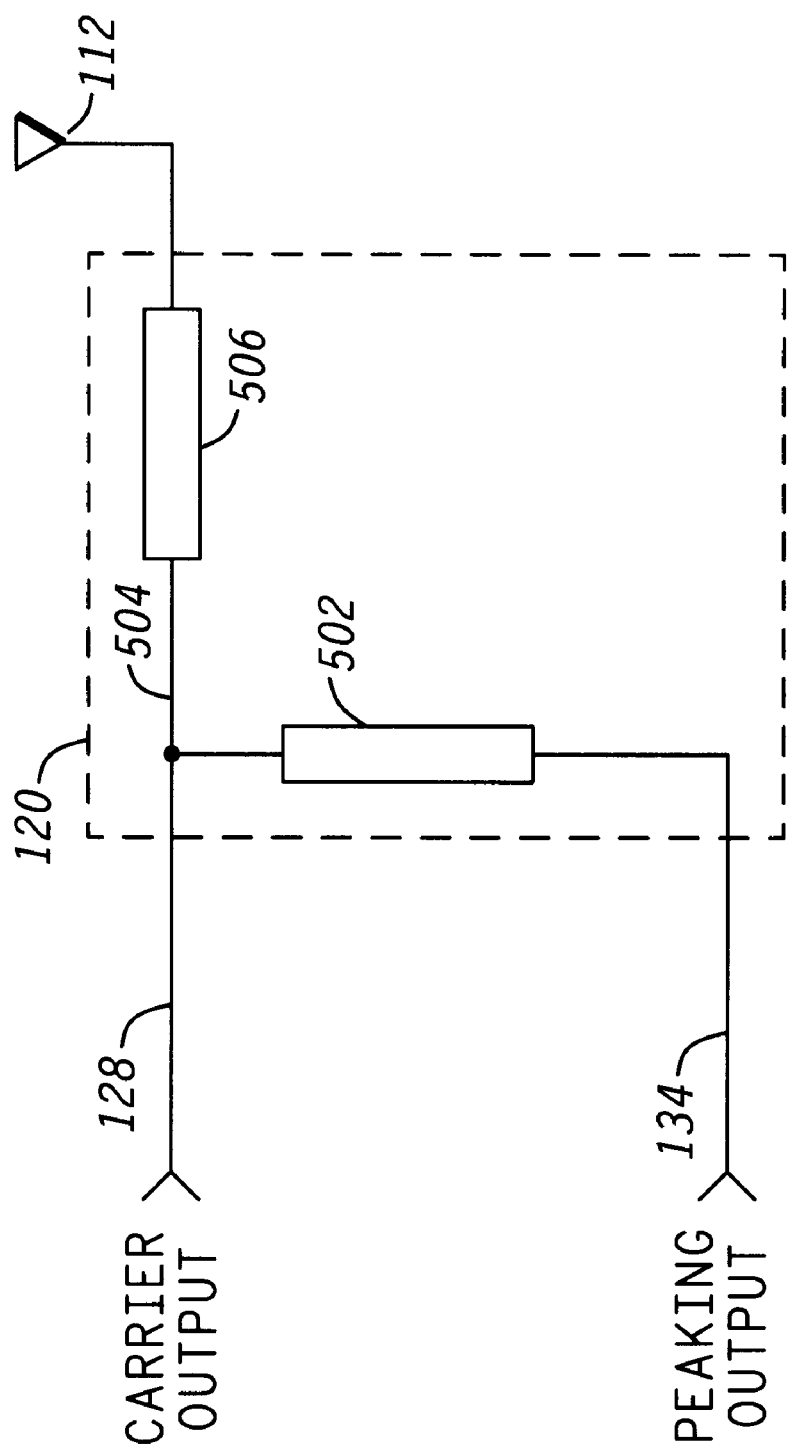
FIG. 5 shows an output combiner for a multimode power amplifier apparatus in accordance with one embodiment of the invention.

Referring now to FIG. 5, there is shown a representative combining means 500, such as that used in block 120 of FIG. 1. The combining may be done with a classic Doherty combiner, as is known in the art, but in the preferred embodiment, the combiner is an inverted Doherty combiner, as described in the above referenced patent application. The major components of the combiner is a phase delay means 502 having a phase delay, and coupled between the carrier output 128 and the peaking output 134. The phase delay means is preferably a quarterwave element to provide the necessary high impedance to the carrier output when the peaking amplifier is not conducting. The phase delay provided by the phase delay means is substantially the same as the phase differential provided by the splitting means and the propagation delay differences between the carrier and peaking paths, so that at a summing node 504 the output of the carrier and peaking paths are substantially in phase. The summed signal is then fed to the antenna 112 through an impedance transforming means 506.

In operating the multimode amplifier apparatus, the first step is selecting a communication mode of the mobile communication device. The modulator then begins producing a modulated signal to be transmitted. The splitting means performs the splitting of the modulated signal to provide an in-phase signal, having a magnitude, and a quadrature signal. In the preferred embodiment, the in-phase signal is fed to the peaking path while the quadrature signal, meaning a minus 90 degree phase differential from the in phase signal, is fed to the carrier path. The carrier amplifier performs amplifying the quadrature signal to provide an amplified quadrature signal, and the peaking amplifier performs amplifying the in-phase signal when the in-phase signal magnitude is above a preselected threshold level to provide an amplified in phase signal. Setting the preselected threshold level is done in correspondence with the communication mode. That is, the threshold level is determined by the communication mode of the mobile communication device, and is held fixed at that level so long as the mobile communication device remains in that mode of communication. Combining the amplified quadrature and amplified in-phase signals, additively in phase, is performed at the combiner, and the combined signal is transmitted through the antenna. It will be recognized by those skilled in the art that the in-phase and quadrature signals provided by the splitting means may be revered if the combiner elements are reversed to a classic Doherty configuration.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An efficient multimode power amplifier for a mobile communication device capable of operating in a plurality of communication modes, comprising:

a carrier amplifier having a carrier input and carrier output;

a peaking amplifier having a threshold control input, a peaking input; and a peaking output;

splitting means for receiving an input signal and providing a first output coupled to the carrier input and a second output coupled to the peaking input, wherein the first and second output have a phase differential;

phase delay means, having a phase delay and coupled between the peaking output and the carrier output, for correcting a phase difference between the peaking output and the carrier output; and threshold control means operably coupled to the threshold control input for selectively providing a control voltage to the threshold control input of the peaking amplifier, the control voltage having a voltage level that is selectively adjusted in correspondence with a choice of communication mode of the mobile communication device.

2. An efficient multimode power amplifier, as defined in claim 1, wherein the phase delay is substantially 90 degrees.

3. An efficient multimode power amplifier, as defined in claim 1, wherein the carrier output forms a summing node, the multimode power amplifier further comprises an impedance transforming means coupled between the summing node and a load.

4. A power amplifier apparatus, comprising:

carrier amplifier means for amplifying a carrier input signal, and having a carrier input and a carrier output;

peaking amplifier means for amplifying a peaking input signal when the peaking input signal is above a threshold level, and having a peaking input, a peaking output, and a threshold control input for setting the threshold level;

splitting means for receiving an input signal and providing the carrier input signal and the peaking input signal, wherein the carrier input signal and the peaking input signal have a phase differential;

phase delay means for delaying the output of the peaking amplifier means coupled between the peaking output and the carrier output; and threshold control means operably coupled to the threshold control input for selectively providing a control voltage to the threshold control input of the peaking amplifier, the control voltage having a voltage level that is selectively adjusted in correspondence with a choice of communication mode of the power amplifier apparatus.

5. A power amplifier apparatus as defined in claim 4, wherein the carrier amplifier means is linear amplifier whose class is selected from the group of class A,AB, or B amplifiers.

6. A method of amplifying a modulated signal in a multimode mobile communication device, comprising the steps of:

selecting a communication mode of the mobile communication device;

splitting the modulated signal to provide an in-phase signal, having a magnitude, and a quadrature signal;

amplifying the quadrature signal to provide an amplified quadrature signal;

amplifying the in-phase signal when the in-phase signal magnitude is above a preselected threshold level to provide an amplified in-phase signal;

setting the preselected threshold level in correspondence with the communication mode; and combining the amplified quadrature and amplified in-phase signals additively in phase.

7. A method of amplifying a modulated signal in a multimode mobile communication device, comprising the steps of:

selecting a communication mode of the mobile communication device;

splitting the modulated signal to provide a quadrature signal, having a magnitude, and an in-phase signal;

amplifying the in-phase signal to provide an amplified in-phase signal;

amplifying the quadrature signal when the quadrature signal magnitude is above a preselected threshold level to provide an amplified quadrature signal;

setting the preselected threshold level in correspondence with the communication mode; and combining the amplified quadrature and amplified in phase signals additively in phase.

8. An efficient multimode power amplifier apparatus for a mobile communication device capable of operating in a plurality of communication modes, comprising:

a carrier amplifier having a fixed bias level and a carrier output;

a peaking amplifier having an adjustable bias level and a peaking output, wherein the bias level of the peaking amplifier is adjusted in correspondence with a choice of communication mode; and combining means for combining additively in phase the carrier output and peaking output.

* * * * *